(12) United States Patent
Kim et al.

(10) Patent No.: US 10,811,354 B2
(45) Date of Patent: Oct. 20, 2020

(54) FUSE ARRAY FOR INTEGRATED CIRCUIT

(71) Applicant: Intel Corporation, Santa Clara, CA (US)

(72) Inventors: Gwang-Soo Kim, Portland, OR (US); Doug B. Ingerly, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/306,538

(22) PCT Filed: Jun. 30, 2016

(86) PCT No.: PCT/US2016/040585
§ 371 (c)(1),
(2) Date: Nov. 30, 2018

(87) PCT Pub. No.: WO2018/004633
PCT Pub. Date: Jan. 4, 2018

(65) Prior Publication Data
US 2019/0326216 A1 Oct. 24, 2019

(51) Int. Cl.
*H01L 23/525* (2006.01)
*H01L 21/768* (2006.01)
*H01L 23/62* (2006.01)

(52) U.S. Cl.
CPC .... *H01L 23/5256* (2013.01); *H01L 21/76801* (2013.01); *H01L 23/62* (2013.01)

(58) Field of Classification Search
CPC .................. H01L 23/5256; H01L 21/76801
See application file for complete search history.

(56) References Cited

U.S. PATENT DOCUMENTS

2004/0017674 A1    1/2004   Romas, Jr. et al.
2007/0252237 A1   11/2007   Ko et al.
(Continued)

FOREIGN PATENT DOCUMENTS

KR    10-2010-0100398 A    9/2010

OTHER PUBLICATIONS

International Search Report and Written Opinion dated Mar. 31, 2017 for International Patent Application No. PCT/US2016/040585, 13 pages.

*Primary Examiner* — Seahvosh Nikmanesh
(74) *Attorney, Agent, or Firm* — Schwabe, Williamson & Wyatt, P.C.

(57) ABSTRACT

Embodiments of the present disclosure describe apparatuses, methods, and systems associated with a fuse array of an integrated circuit. An integrated circuit may include a first metallization layer including a plurality of trenches separated by an interlayer dielectric (ILD), wherein the ILD forms a protrusion that extends above a top surface of the trenches. An etch stop layer may be disposed on the first metallization layer. The integrated circuit may further include a fuse disposed on the etch stop layer, wherein the fuse includes a fuse channel coupled between an anode and a cathode, wherein the fuse channel is disposed directly above the protrusion and is in contact with the etch stop layer. The integrated circuit may additionally or alternatively include one or more dummy regions adjacent to the fuse channel and separated from the fuse channel by a dielectric material. Other embodiments may be described and/or claimed.

14 Claims, 7 Drawing Sheets

(56) References Cited

U.S. PATENT DOCUMENTS

2009/0302417 A1  12/2009  Kim et al.
2014/0332923 A1  11/2014  Filippi et al.
2016/0163643 A1* 6/2016  Choi .................. H01L 23/5256
                                                257/529

* cited by examiner

FUSE ARRAY FOR INTEGRATED CIRCUIT

CROSS REFERENCE TO RELATED APPLICATIONS

The present application is a national phase entry under 35 U.S.C. § 371 of International Application No. PCT/US2016/040585, filed Jun. 30, 2016, entitled "FUSE ARRAY FOR INTEGRATED CIRCUIT", which designated, among the various States, the United States of America. The Specifications of the PCT/US2016/040585 Application is hereby incorporated by reference.

FIELD

Embodiments of the present disclosure generally relate to the field of integrated circuits, and more particularly, to fuse arrays for integrated circuits.

BACKGROUND

There is high emphasis on making back-end metallization for integrated circuits more robust. However, since the fuse array of the integrated circuit is part of the active die and goes through the same processing steps as the metallization, the fuse array also becomes robust, thereby making the fuses harder to break.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
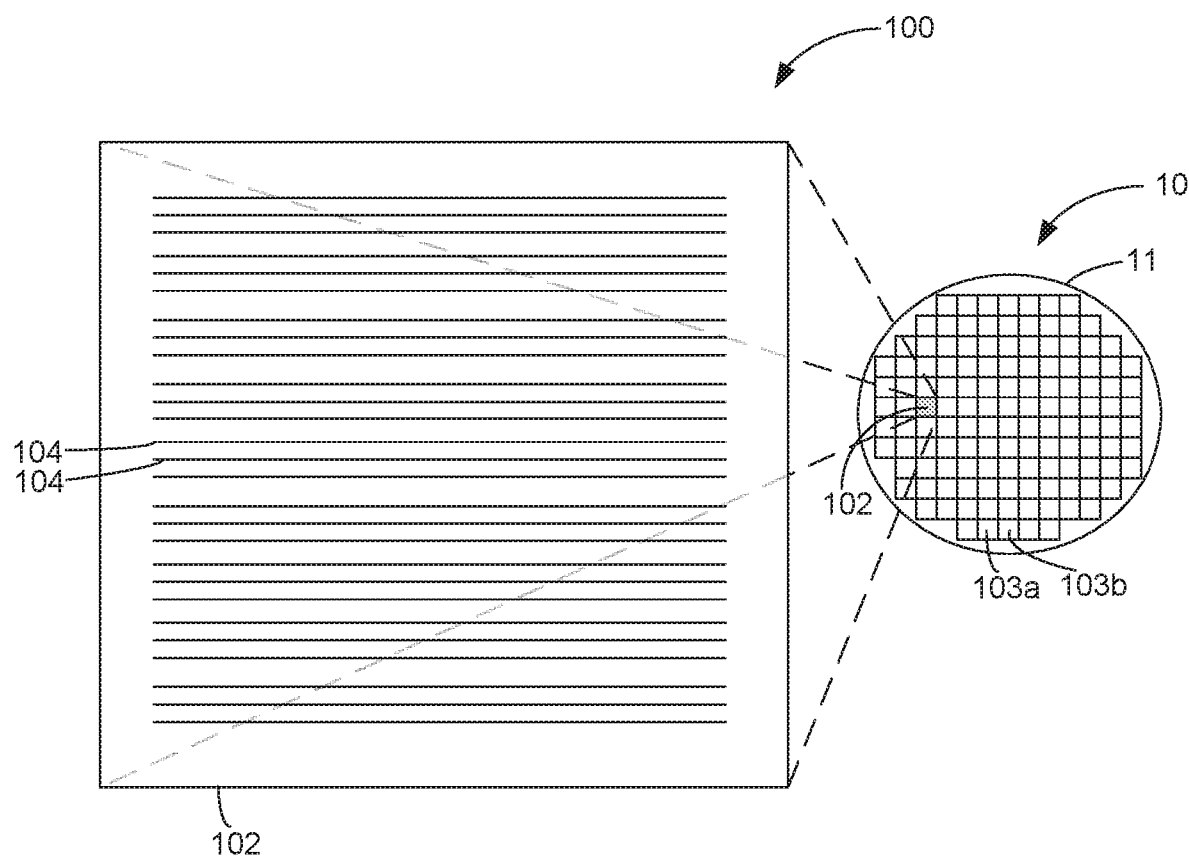
FIG. 1 schematically illustrates a top view of an example die in wafer form and in singulated form, in accordance with some embodiments.

Embodiments of the present disclosure describe apparatuses, methods, and systems associated with a fuse array of an integrated circuit. An integrated circuit may include a first metallization layer including a plurality of trenches separated by an interlayer dielectric (ILD), wherein the ILD forms a protrusion that extends above a top surface of the trenches. In some embodiments, the protrusion may be an artifact of a chemical mechanical planarization (CMP) process that is performed on the first metallization layer. The height of the protrusion may be based on the distance between adjacent trenches, with a higher protrusion formed between adjacent trenches that are farther apart.

An etch stop layer may be disposed on the first metallization layer. The integrated circuit may further include a fuse disposed on the etch stop layer, wherein the fuse includes a fuse channel coupled between an anode and a cathode, wherein the fuse channel is disposed directly above the protrusion and is in contact with the etch stop layer. The fuse channel, anode, and cathode may be formed of a metal (e.g., copper). The fuse channel may be aligned with the fuse channel between a first pair of adjacent trenches that are separated by a greater separation distance than a second pair of adjacent trenches of the first metallization layer. Accordingly, the protrusion may provide the fuse channel with a reduced height, thereby making the fuse easier to break.

In some embodiments, the integrated circuit may additionally or alternatively include one or more dummy regions adjacent to the fuse channel and separated from the fuse channel, the anode, and the cathode by a dielectric material. The dummy regions may be formed of a metal (e.g., the same metal as the fuse). CMP may be performed on the integrated circuit after deposition of the metal of the fuse and dummy regions. The rate of material removal of the CMP process may be greater for a region of the integrated circuit with a greater ratio of metal to dielectric material. Accordingly, the dummy regions may cause the CMP process to remove more of the fuse channel, thereby further reducing the thickness of the fuse channel.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, side, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 schematically illustrates a top view of an example die 102 in wafer form 10 and in singulated form 100, in accordance with some embodiments. In some embodiments, the die 102 may be one of a plurality of dies (e.g., dies 102, 103a, 103b) of a wafer 11 composed of semiconductor material such as, for example, silicon or other suitable material. The plurality of dies may be formed on a surface of the wafer 11. Each of the dies may be a repeating unit of a semiconductor product that includes one or more ICs (e.g., IC 400 and/or an IC formed using method 300) as described herein. For example, the die 102 may include circuitry having transistor structures 104 such as, for example, one or more channel bodies (e.g., fin structures, nanowires, planar bodies, etc.) that provide a channel pathway for mobile charge carriers of one or more transistor devices or source/drain regions. Transistor electrode assemblies (e.g., terminal contacts) may be formed on and coupled with the one or more transistor structures 104 to route electrical energy to or from the transistor structures 104. For example, terminal contacts may be electrically coupled with a channel body to provide a gate electrode for delivery of a threshold voltage and/or a source/drain current to provide mobile charge carriers for operation of a transistor device. Although the transistor structures 104 are depicted in rows that traverse a substantial portion of the die 102 in FIG. 1 for the sake of simplicity, it is to be understood that the transistor structures 104 may be configured in any of a wide variety of other suitable arrangements on the die 102 in other embodiments, including, for example, vertical and horizontal features having much smaller dimensions than depicted.

After a fabrication process of the semiconductor product embodied in the dies is complete, the wafer 11 may undergo a singulation process in which each of the dies (e.g., die 102) is separated from one another to provide discrete "chips" of the semiconductor product. The wafer 11 may be any of a variety of sizes. In some embodiments, the wafer 11 has a diameter ranging from about 25.4 mm to about 450 mm. The wafer 11 may include other sizes and/or other shapes in other embodiments. According to various embodiments, the transistor structures 104 may be disposed on a semiconductor substrate in wafer form 10 or singulated form 100. The transistor structures 104 may be incorporated in a die 102 for logic or memory, or combinations thereof. In some embodiments, the transistor structures 104 may be part of a system-on-chip (SoC) assembly.

In various embodiments, the die 102 may include a fuse array as described herein. The fuse array may be used to store information associated with the die, such as an encryption key, identifying information associated with the die, and/or other suitable information.

Figure 2:
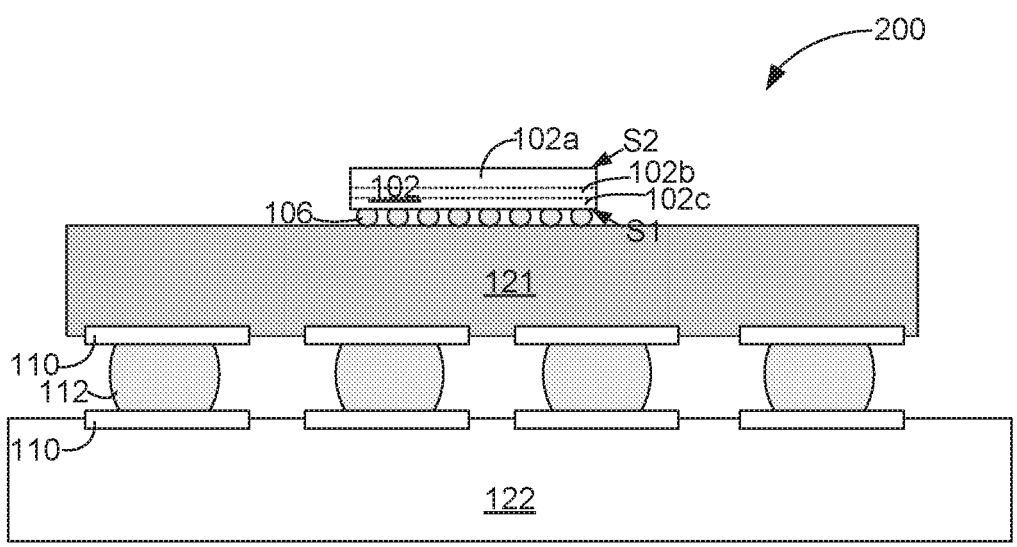
FIG. 2 schematically illustrates a cross-section side view of an integrated circuit (IC) assembly, in accordance with some embodiments.

FIG. 2 schematically illustrates a cross-section side view of an IC assembly 200, in accordance with some embodiments. In some embodiments, the IC assembly 200 may include one or more dies (hereinafter "die 102") electrically and/or physically coupled with a package substrate 121. In some embodiments, the package substrate 121 may be electrically coupled with a circuit board 122, as can be seen. In some embodiments, an IC assembly 200 may include one or more of the die 102, package substrate 121 and/or circuit board 122, according to various embodiments. Embodiments described herein for a fuse array may be implemented in any suitable IC device according to various embodiments.

The die 102 may represent a discrete product made from a semiconductor material (e.g., silicon) using semiconductor fabrication techniques such as thin film deposition, lithography, etching and the like used in connection with forming CMOS devices. In some embodiments, the die 102 may be, include, or be a part of a processor, memory, SoC or ASIC. In some embodiments, an electrically insulative material such as, for example, molding compound or underfill material (not shown) may encapsulate at least a portion of the die 102 and/or die-level interconnect structures 106.

The die 102 can be attached to the package substrate 121 according to a wide variety of suitable configurations including, for example, being directly coupled with the package substrate 121 in a flip-chip configuration, as depicted. In the flip-chip configuration, an active side, S1, of the die 102 including circuitry is attached to a surface of the package substrate 121 using die-level interconnect structures 106 such as bumps, pillars, or other suitable structures that may also electrically couple the die 102 with the package substrate 121. The active side S1 of the die 102 may include active devices such as, for example, transistor devices. An inactive side, S2, may be disposed opposite to the active side S1, as can be seen.

The die 102 may generally include a semiconductor substrate 102a, one or more device layers (hereinafter "device layer 102b") and one or more interconnect layers (hereinafter "interconnect layer 102c"). The semiconductor substrate 102a may be substantially composed of a bulk semiconductor material such as, for example silicon, in some embodiments. In accordance with various embodiments, the semiconductor substrate 102a may include a plurality of substrate regions with isolation regions disposed between the substrate regions. In some embodiments, an isolation material may be disposed in the isolation regions.

The device layer 102b may represent a region where active devices such as transistor devices are formed on the semiconductor substrate. The device layer 102b may include, for example, transistor structures such as channel bodies and/or source/drain regions of transistor devices. The interconnect layer 102c may include interconnect structures that are configured to route electrical signals to or from the active devices in the device layer 102b. For example, the interconnect layer 102c may include horizontal lines (e.g., trenches) and/or vertical plugs (e.g., vias) or other suitable features to provide electrical routing and/or contacts. In various embodiments, one or more layers of the interconnect layer 102c may include a fuse array as described herein.

In some embodiments, the die-level interconnect structures 106 may be electrically coupled with the interconnect layer 102c and configured to route electrical signals between the die 102 and other electrical devices. The electrical signals may include, for example, input/output (I/O) signals and/or power/ground signals that are used in connection with operation of the die 102.

In some embodiments, the package substrate 121 is an epoxy-based laminate substrate having a core and/or build-up layers such as, for example, an Ajinomoto Build-up Film (ABF) substrate. The package substrate 121 may include other suitable types of substrates in other embodiments including, for example, substrates formed from glass, ceramic, or semiconductor materials.

The package substrate 121 may include electrical routing features configured to route electrical signals to or from the die 102. The electrical routing features may include, for example, pads or traces (not shown) disposed on one or more surfaces of the package substrate 121 and/or internal routing features (not shown) such as, for example, trenches, vias or other interconnect structures to route electrical signals through the package substrate 121. For example, in some embodiments, the package substrate 121 may include electrical routing features such as pads (not shown) configured to receive the respective die-level interconnect structures 106 of the die 102.

The circuit board 122 may be a printed circuit board (PCB) composed of an electrically insulative material such as an epoxy laminate. For example, the circuit board 122 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Interconnect structures (not shown) such as traces, trenches, or vias may be formed through the electrically insulating layers to route the electrical signals of the die 102 through the circuit board 122. The circuit board 122 may be composed of other suitable materials in other embodiments. In some embodiments, the circuit board 122 is a motherboard (e.g., motherboard 502 of FIG. 5).

Package-level interconnects such as, for example, solder balls 112 may be coupled to one or more pads (hereinafter "pads 110") on the package substrate 121 and/or on the circuit board 122 to form corresponding solder joints that are configured to further route the electrical signals between the package substrate 121 and the circuit board 122. The pads 110 may be composed of any suitable electrically conductive material such as metal including, for example, nickel (Ni), palladium (Pd), gold (Au), silver (Ag), copper (Cu), and combinations thereof. Other suitable techniques to physically and/or electrically couple the package substrate 121 with the circuit board 122 may be used in other embodiments.

The IC assembly 200 may include a wide variety of other suitable configurations in other embodiments including, for example, suitable combinations of flip-chip and/or wire-bonding configurations, interposers, multi-chip package configurations including system-in-package (SiP) and/or package-on-package (PoP) configurations. Other suitable techniques to route electrical signals between the die 102 and other components of the IC assembly 200 may be used in some embodiments.

Figure 3:
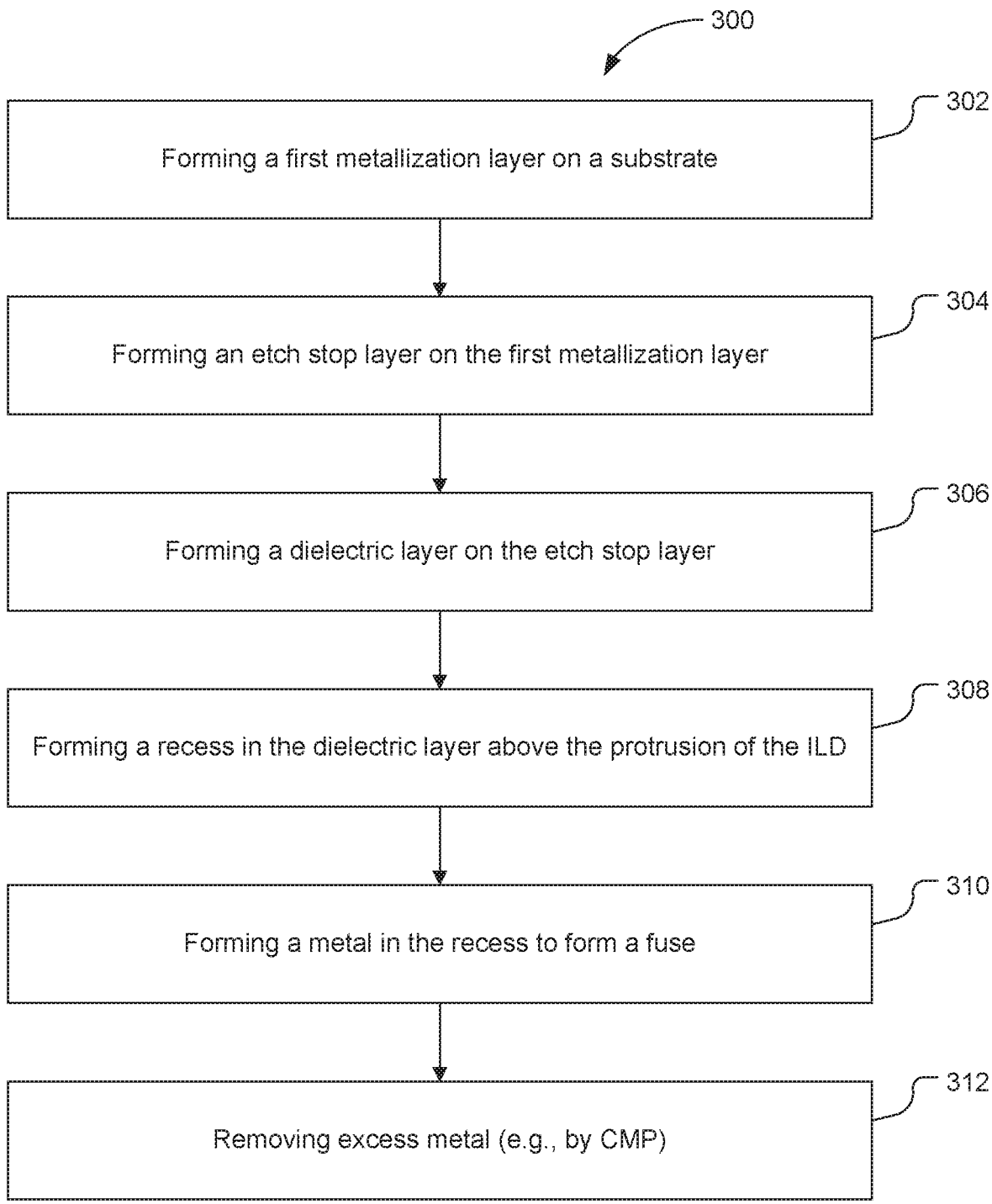
FIG. 3 is a flow diagram that illustrates a process for forming a fuse array of an IC, in accordance with some embodiments.

FIG. 3 is an illustrative flow diagram of a process 300 for forming a fuse array of an integrated circuit, in accordance with various embodiments. FIGS. 4A-4G illustrate cross-sectional side views of an integrated circuit 400 (also referred to as IC 400) at various stages of the process 300 and FIG. 4H illustrates a top view of the integrated circuit 400 shown in FIG. 4G, in accordance with various embodiments. Accordingly, the process 300 will be described below with reference to FIGS. 4A-4H. For ease of understanding, not all elements may be labeled in every one of FIGS. 4A-4H.

At block 302, the process 300 may include forming a first metallization layer on a substrate. The first metallization layer may include a plurality of trenches separated by an ILD. Forming the first metallization layer may include forming the ILD on the substrate, etching recesses in the ILD, and depositing a metal (e.g., copper) in the recesses to form the trenches. In some embodiments, one or more additional layers, such as one or more device layers (e.g., including transistors and/or other active devices) and/or one or more additional metallization layers, may be disposed between the first metallization layer and the substrate.

In some embodiments, after depositing the metal in the recesses, excess metal above the recesses and/or on the ILD adjacent to the recesses may be removed, such as by performing CMP or another suitable process. In some embodiments, the CMP process may include one or more of: 1) bulk removal of the excess metal (e.g., by mechanical grinding); 2) removing the remaining metal disposed on the ILD between the trenches (e.g., by application of a rotating pad on the surface of the ILD with a slurry applied over the wafer); and 3) polishing the surface of the first metallization layer (e.g., the top surface of the ILD and/or trenches) to planarize the surface and remove defects (e.g., by application of a polishing pad). In some embodiments, one or more of the CMP operations described above may be omitted or combined with another operation. Additionally, or alternatively, in some embodiments the CMP process may include one or more additional operations.

In various embodiments, the CMP process may cause the ILD to form a protrusion that extends above a top surface of the trenches. The height of the protrusion may depend on the distance between adjacent trenches of the first metallization layer. Accordingly, the ILD may form a higher protrusion between adjacent trenches that are further apart than between adjacent trenches that are closer to together.

Figure 4A:
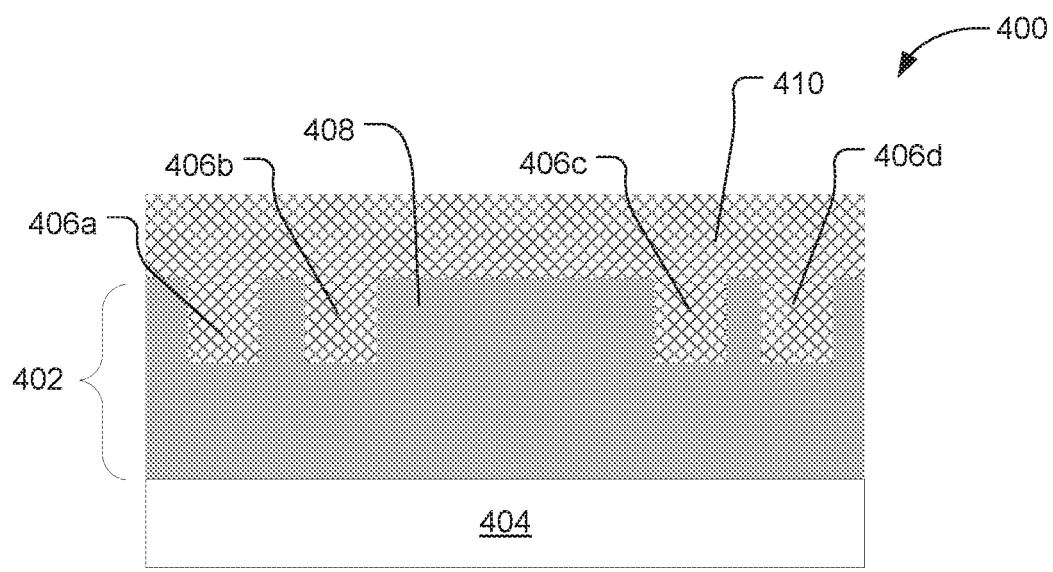
FIGS. 4A-4G schematically illustrate cross-sectional side views of an IC structure at various stages of the process of FIG. 3, in accordance with some embodiments.

FIG. 4A illustrates the integrated circuit 400 subsequent to formation of a first metallization layer 402 on a substrate 404. The first metallization layer includes a plurality of trenches 406a-d separated by an ILD 408. Excess metal 410 is disposed above the trenches 406a-d and on the ILD 408 between the trenches 406a-d. In some embodiments, one or more additional layers (not shown), such as one or more device layers (e.g., including transistors and/or other active devices) and/or one or more additional metallization layers, may be disposed between the first metallization layer 402 and the substrate 404.

Figure 4B:
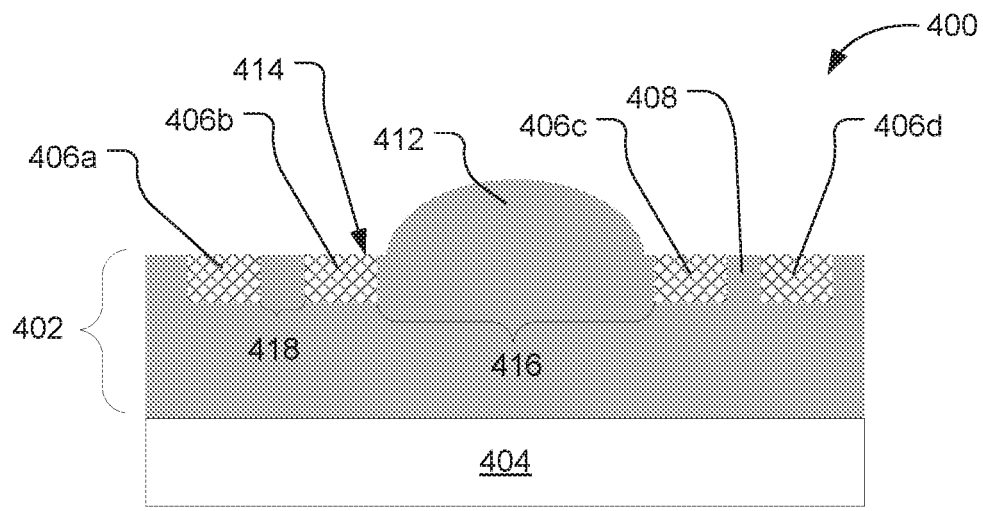

FIG. 4B illustrates the integrated circuit 400 subsequent to removing the excess metal 410 (e.g., using CMP). The ILD 408 forms a protrusion 412 that extends above a top surface 414 of the trenches 406a-d. The protrusion 412 is disposed between trenches 406b and 406c which are separated by a first separation distance 416. The trenches 406a and 406b may be separated by a second separation distance 418. In embodiments, the first separation distance 416 may be greater than the second separation distance 418, such as by a factor of two or more. Additionally, or alternatively, the first separation distance 416 may be about 100 nanometers (nm) to about 10 micrometers (μm). Thus, a height of the protrusion 412 above the top surface 414 may be greater than a height of the ILD 408 between the trenches 406a and 406b and/or between the trenches 406c and 406d. The ILD 408 may form a smaller protrusion (not shown) between the trenches 406a and 406b and/or between the trenches 406c and 406d or may have a top surface that is substantially coplanar with the top surface 414 of the trenches 406a-d between the trenches 406a and 406b and/or between the trenches 406c and 406d.

Figure 4C:
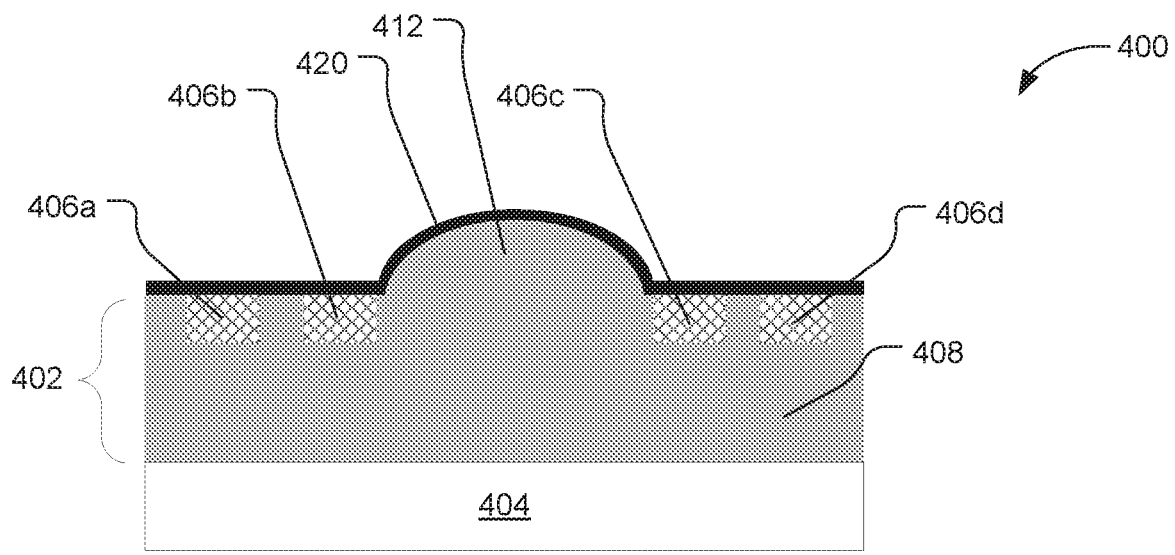

At block 304, the process 300 may include forming an etch stop layer on the first metallization layer. The etch stop layer may include, for example, silicon nitride (SixNy), silicon carbide (SixCy), silicon carbonitride (SiCxNy), and/or a metal oxide based material such AlOx, HfOx TiOx. FIG. 4C illustrates the integrated circuit 400 subsequent to formation of an etch stop layer 420 on the first metallization layer 402. The etch stop layer 420 may be disposed on and in contact with the trenches 406a-d and the ILD 408.

At block 306, the process 300 may include forming a dielectric layer on the etch stop layer. The dielectric layer may be formed by any suitable deposition process, such as chemical vapor deposition (CVD), atomic layer deposition (ALD), or physical vapor deposition (PVD). Additionally, the dielectric layer may include any suitable dielectric material or combination of dielectric materials, including one or more high-K or low-K materials. A material may be considered high-K if its dielectric constant is higher than that of silica and may be considered low-K if its dielectric constant is lower than that of silica.

For example, the dielectric layer may include silicon oxide ($SiO_2$), silicon oxynitride ($SiO_xN_y$), silicon nitride ($Si_xN_y$) aluminum oxide ($Al_2O_3$), hafnium oxide ($HfO_2$), hafnium aluminum oxide ($HfAl_xO_y$), hafnium silicon oxide ($HfSi_xO_y$), zirconium oxide ($ZrO_2$), zirconium silicon oxide ($ZrSi_xO_y$), lanthanum oxide ($La_2O_3$), yttrium oxide ($Y_2O_3$), lanthanum aluminum oxide ($LaAl_xO_y$), tantalum oxide ($Ta_2O_5$), titanium oxide ($TiO_2$), barium strontium titanium oxide ($BaSrTi_xO_y$), barium titanium oxide ($BaTi_xO_y$), strontium titanium oxide ($SrTi_xO_y$), lead scandium tantalum oxide ($PbSc_xTa_yO_z$), or lead zinc niobate ($PbZn_xNb_yO_z$), carbon doped oxide (CDO), organic polymers such as perfluorocyclobutane or polytetrafluoroethylene, fluorosilicate glass (FSG), and organosilicates such as silsesquioxane, siloxane, or organosilicate glass, or combinations thereof, where x, y, and z represent suitable quantities of the respective elements. In some embodiments, an annealing process may be carried out on the dielectric layer to improve its quality when a high-k material is used. Other materials may be used in other embodiments for the dielectric layer.

The ILD of the first metallization layer may additionally or alternatively include one of the above-described dielectric materials. For example, in some embodiments, the ILD may include the same dielectric material or combination of dielectric materials as the dielectric layer formed at block 306.

Figure 4D:
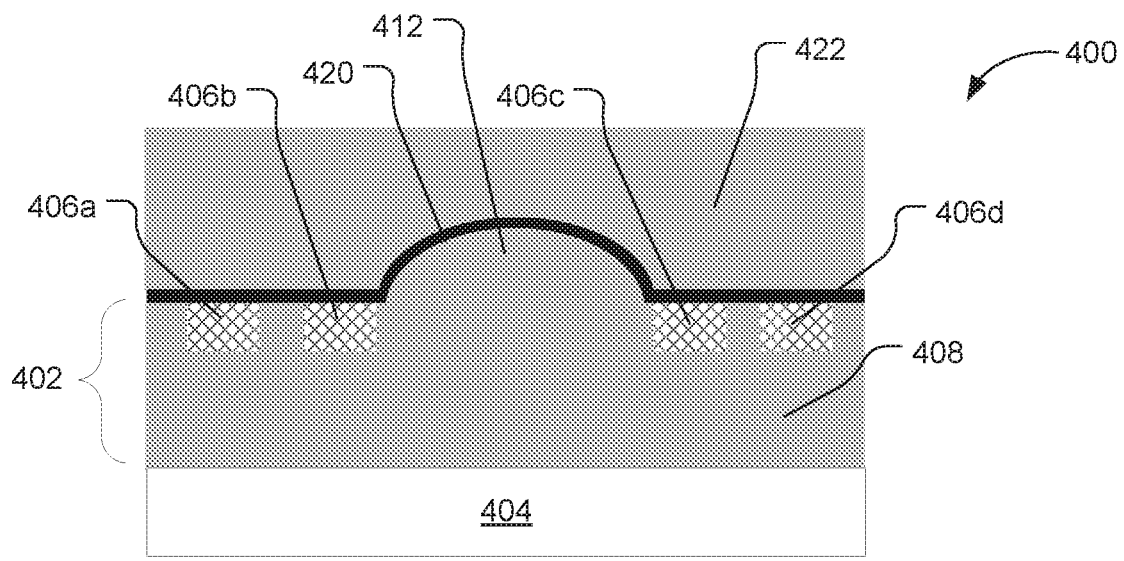

FIG. 4D illustrates the integrated circuit 400 subsequent to formation of a dielectric layer 422 on the etch stop layer 420.

At block 308, the process 300 may include forming a recess in the dielectric layer above the protrusion of the ILD. The recess may expose the etch stop layer on the protrusion. Accordingly, the etch stop layer and/or protrusion may extend above a bottom surface of the recess. In some embodiments, a top surface of the dielectric layer may be planarized prior to forming the recess, to provide control and/or consistency of the depth of the recess. The forming the recess at block 308 may be performed as part of patterning the dielectric layer for formation of the fuse (e.g., the fuse channel, the anode, and the cathode) and/or dummy regions. FIG. 4H, further discussed below, shows a top view of the fuse after patterning the dielectric layer and subsequent formation of the fuse channel, anode, cathode, and dummy regions.

Figure 4E:
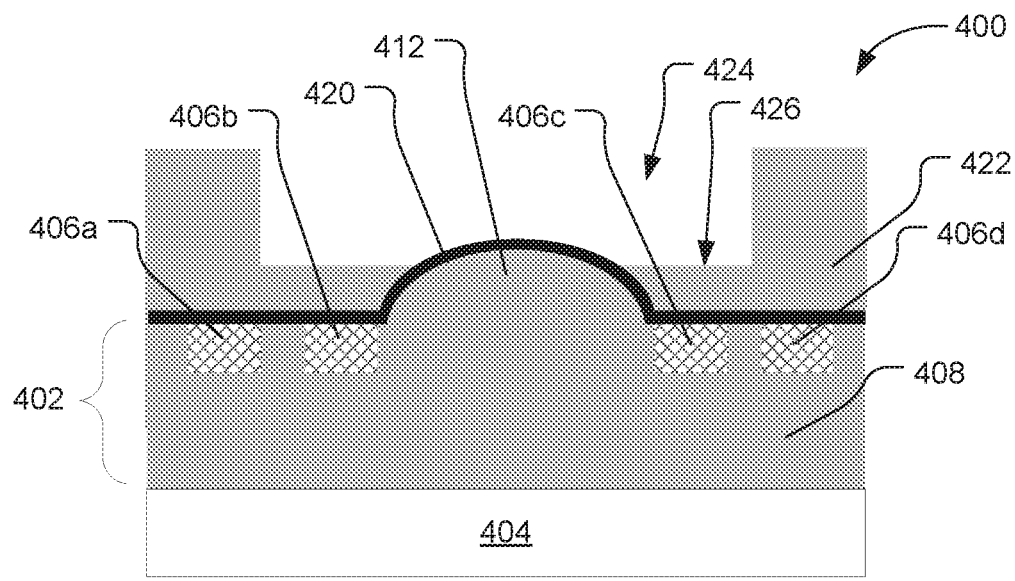

FIG. 4E illustrates the integrated circuit 400 subsequent to formation of a recess 424 in the dielectric layer 422 above the protrusion. The etch stop layer 420 is exposed by the recess 424, and the etch stop layer 420 and protrusion 412 extend above a bottom surface 426 of the recess.

At block 310, the process 300 may include forming a metal (e.g., copper) in the recess. The metal may form the fuse channel, anode, and cathode of the fuse. For example, the fuse channel may be formed on the etch stop layer above the protrusion and extend across the protrusion, the anode may be coupled to the fuse channel on a first side of the protrusion, and the cathode may be coupled to the fuse channel on a second side of the protrusion, opposite the first side.

Figure 4F:
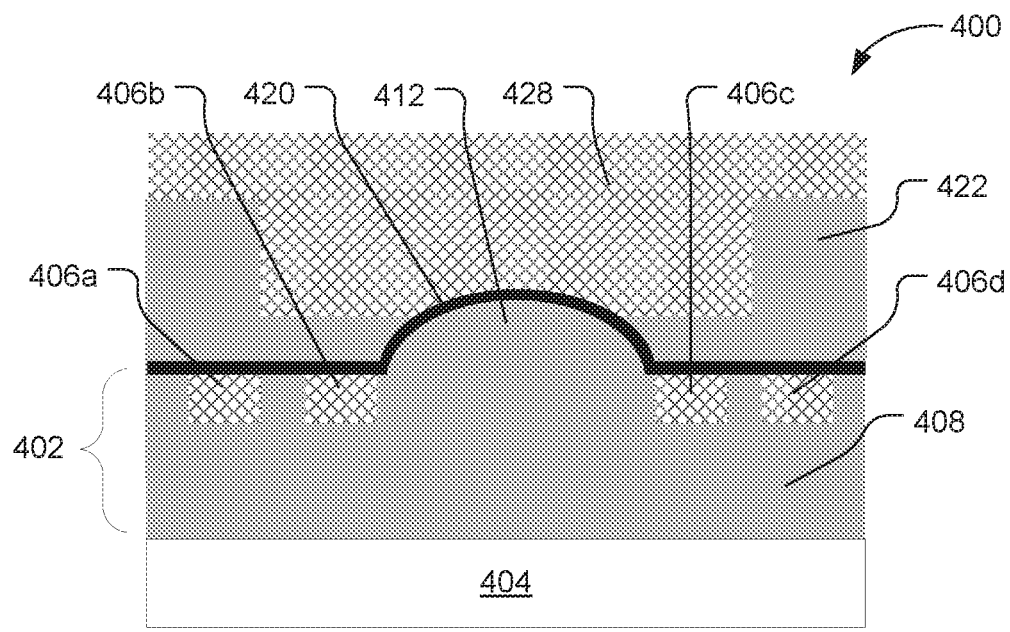

FIG. 4F illustrates the integrated circuit 400 subsequent to formation of a metal 428 in the recess 424.

At block 312, the process 300 may include removing excess metal that was deposited at block 310. The excess metal may be removed, for example, by CMP. The removal process may also remove some of the dielectric layer.

Figure 4G:
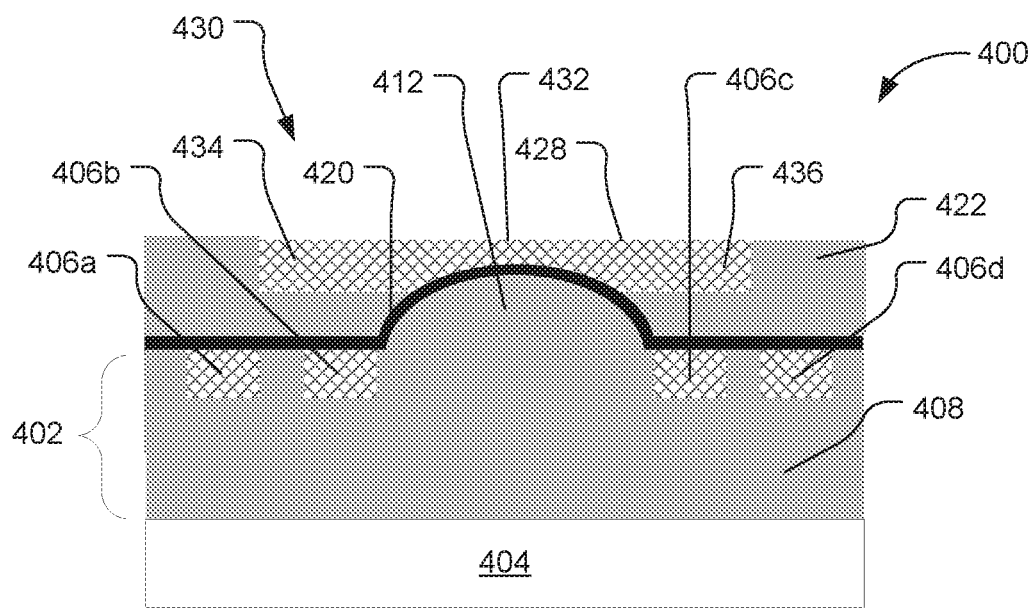
Figure 4H:
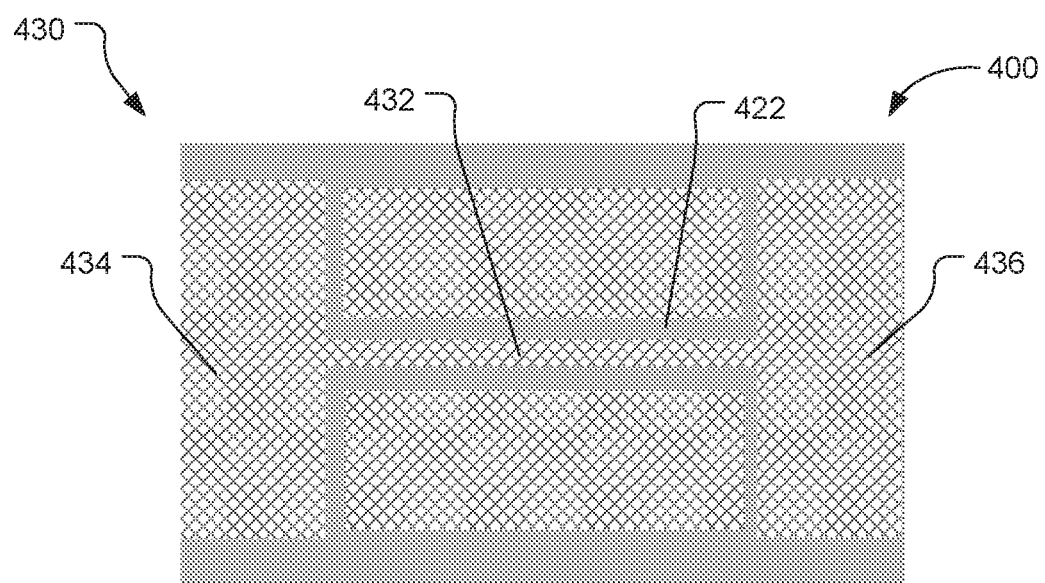
FIG. 4H schematically illustrates a top view of an IC device including a fuse, in accordance with some embodiments.

FIG. 4G illustrates the integrated circuit 400 subsequent to removal of excess metal 428. The metal 428 forms a fuse 430, including a fuse channel 432, an anode 434, and a cathode 436. The fuse channel 432 is disposed directly above the protrusion 412 and in contact with the etch stop layer 420. The anode 434 is coupled to the fuse channel 432 on a first side of the protrusion 412, and the cathode 436 is coupled to the fuse channel 432 on a second side of the protrusion, opposite the first side. Since the fuse channel 432 is disposed directly above the protrusion 412 and in contact with the etch stop layer 420, a height of the fuse channel 432 is less than it would be if the fuse channel 432 were not disposed directly above a protrusion. For example, the height of the fuse channel 432 may be less than the height of the anode 434 and/or cathode 436. The reduced height of the fuse channel 432 may make the fuse 430 easier to break (e.g., the fuse channel 432 may break at a lower current/voltage and/or in a shorter time period when the breakage current/voltage is applied).

FIG. 4H illustrates a top view of the integrated circuit 400 shown in FIG. 4G. FIG. 4G illustrates a cross-sectional view of the integrated circuit 400 along the line A-A shown in FIG. 4H. As shown in FIG. 4H, the integrated circuit 400 includes dummy regions 438a-b disposed on opposite sides of the fuse channel 432. The dummy regions 438a-b are separated from the fuse channel 432, the anode 434, and the cathode 436 by the dielectric layer 422. The dummy regions 438a-b may be formed of metal (e.g., the same metal as the fuse 430, such as copper), but may not be electrically coupled to the fuse 430. Additionally, in some embodiments, the dummy regions 438a-b may not be electrically coupled to any other component of the integrated circuit 400. As shown, the anode 434 and cathode 436 may extend laterally, and the dummy regions 438a-b may be disposed between the anode 434 and the cathode 436.

When CMP is performed at block 312 to remove the excess metal from the fuse 430, the rate of material removal may vary between regions of the integrated circuit 400 based on the ratio of metal to dielectric material in the region. The rate of material removal may generally increase with an increasing ratio of metal to dielectric material (e.g., when there is more metal in the region).

As shown in FIG. 4H, the dummy regions 438a-b may increase the ratio of metal to dielectric in the region around and including the fuse channel 432. Accordingly, the CMP process may remove more material from the fuse channel 432 than would be removed if the dummy regions 438a-b were not present (e.g., if there was more dielectric material in place of the dummy regions 438a-b). Thus, the dummy regions 438a-b may cause the fuse channel 432 to have a lower height and therefore be easier to break.

In some embodiments, a width 440 of the dielectric layer 422 between the fuse channel 432 and the dummy regions 438*a-b* may be about 10 nm to about 100 nm.

Accordingly, the alignment of the fuse channel 432 with the protrusion 412 and/or the presence of the dummy regions 438*a-b* may provide the fuse channel 432 with a low height, thereby making the fuse 430 easier to break. The process 300 may be compatible with existing processes for back-end metallization, so it may be performed concurrently with forming a second metallization layer on the first metallization layer (e.g., adjacent to the fuse 430 in the same plane of the integrated circuit 400 as the fuse 430) and/or using the same processes used for forming the back-end metallization layers.

In various embodiments, the integrated circuit 400 may include a fuse array having a plurality of fuses 430. The fuse array may be programmed with information by breaking some of the fuses 430. The fuses 430 may be broken by applying a current and/or voltage between the anode 434 and cathode 436 across the fuse channel 432. The current and/or voltage may damage the fuse channel 432 to create an open circuit between the anode 434 and the cathode 436. The information stored by the fuse array may include a security key associated with the integrated circuit 400, identifying information associated with the integrated circuit 400 (e.g., lot number, wafer number, die location, and/or manufacturing facility), and/or other suitable information. In some embodiments, the fuse array may be programmed prior to the integrated circuit 400 being shipped to a customer.

Figure 5:
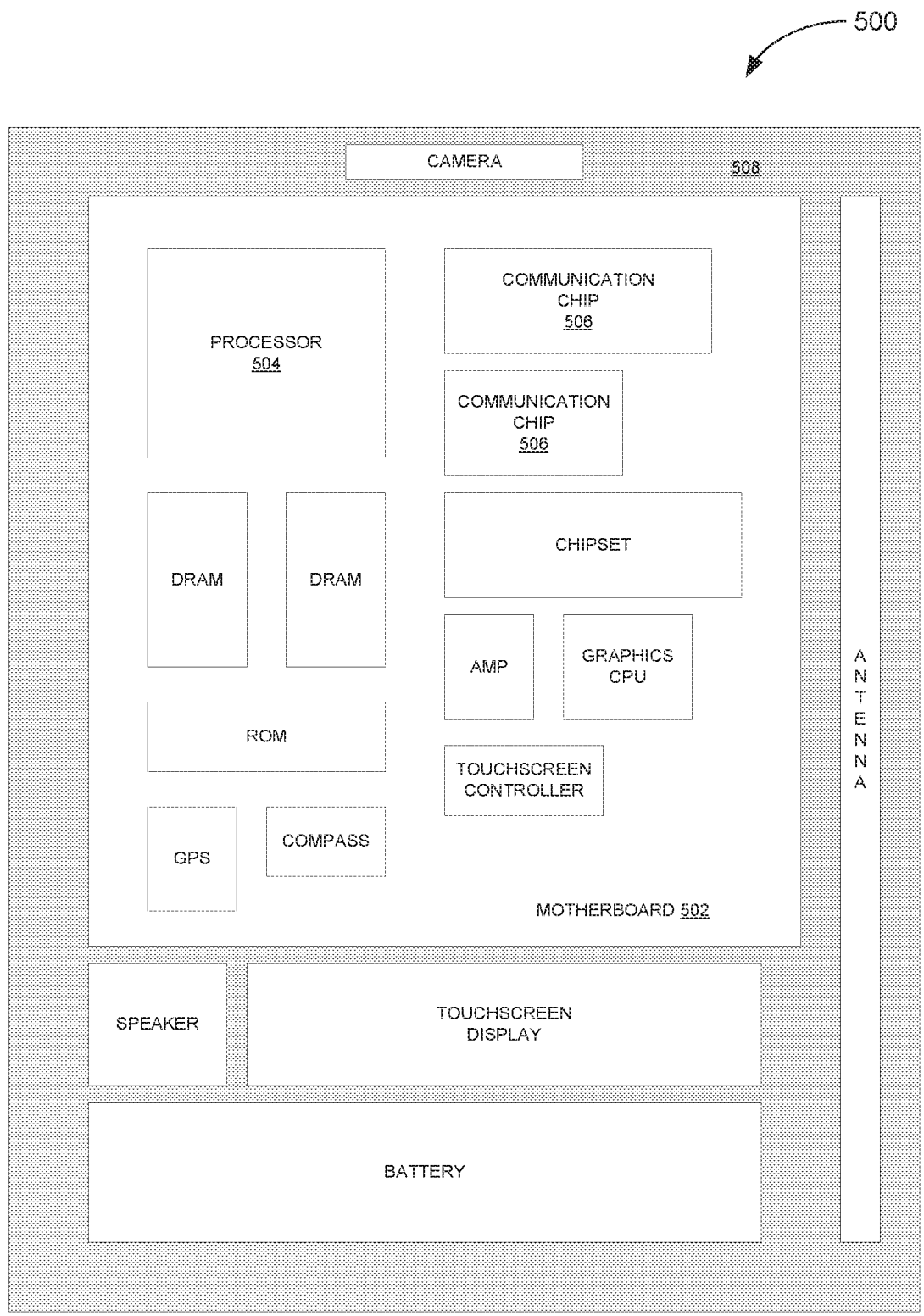
FIG. 5 schematically illustrates an example system that may include an IC device as described herein, in accordance with some embodiments.

FIG. 5 schematically illustrates an example system (e.g., computing device 500) that may include fuse array (e.g., IC 400 and/or a fuse array fabricated using the process 300) as described herein, in accordance with some embodiments. Components of the computing device 500 may be housed in an enclosure (e.g., housing 508). The motherboard 502 may include a number of components, including but not limited to a processor 504 and at least one communication chip 506. The processor 504 may be physically and electrically coupled to the motherboard 502. In some implementations, the at least one communication chip 506 may also be physically and electrically coupled to the motherboard 502. In further implementations, the communication chip 506 may be part of the processor 504.

Depending on its applications, computing device 500 may include other components that may or may not be physically and electrically coupled to the motherboard 502. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 506 may enable wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 506 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 506 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 506 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 506 may operate in accordance with other wireless protocols in other embodiments.

The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, EV-DO, and others.

In various embodiments, the processor 504 of the computing device 500 may include an IC structure including a fuse array as described herein (e.g., the IC 400 and/or a fuse array fabricated using the process 300). The term "processor" may refer to any device or portion of a device that processes electronic data from registers and/or memory to transform that electronic data into other electronic data that may be stored in registers and/or memory.

The communication chip 506 may additionally or alternatively include a fuse array as described herein (e.g., the IC 400 and/or a fuse array fabricated using the process 300). In further implementations, another component (e.g., memory device or other integrated circuit device) housed within the computing device 500 may include a fuse array as described herein (e.g., the IC 400 and/or a fuse array fabricated using the process 300).

In various implementations, the computing device 500 may be a mobile computing device, a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Some non-limiting Examples are provided below.

Example 1 is an integrated circuit comprising: a first metallization layer including a plurality of trenches separated by an interlayer dielectric (ILD), wherein the ILD forms a protrusion that extends above a top surface of the trenches; an etch stop layer disposed on the first metallization layer; and a fuse disposed on the etch stop layer, wherein the fuse includes a fuse channel coupled between an anode and a cathode, wherein the fuse channel is disposed directly above the protrusion and is in contact with the etch stop layer.

Example 2 is the integrated circuit of Example 1, further comprising a dummy region formed of a metal and disposed adjacent to the fuse channel, wherein the dummy region is separated from the fuse channel, the anode, and the cathode by a dielectric material.

Example 3 is the integrated circuit of Example 2, wherein a width of the dielectric material between the fuse channel and the dummy region is less than 100 nanometers.

Example 4 is the integrated circuit of Example 2, wherein the dummy region is disposed between the anode and the cathode.

Example 5 is the integrated circuit of Example 2, wherein the dummy region is a first dummy region, and wherein the integrated circuit further includes a second dummy region disposed adjacent to the fuse channel on an opposite side of the fuse channel from the first dummy region, wherein the second dummy region is separated from the fuse channel, the anode, and the cathode by the dielectric material.

Example 6 is the integrated circuit of Example 2, wherein the fuse channel and the dummy region are formed of copper.

Example 7 is the integrated circuit of any one of Examples 1 to 6, wherein the anode is disposed on a first side of the protrusion, the cathode is disposed on a second side of the protrusion, and the fuse channel extends across the protrusion.

Example 8 is the integrated circuit of any one of Examples 1 to 6, wherein the plurality of trenches include a first pair of adjacent trenches and a second pair of adjacent trenches, wherein the protrusion is disposed between the first pair of trenches, and wherein a first separation distance between the first pair of trenches is greater than a second separation distance between the second pair of trenches by a factor of two or more.

Example 9 is a method for forming a fuse array of an integrated circuit, the method comprising: forming a dielectric layer on a substrate; forming a fuse channel in the dielectric layer, forming an anode in the dielectric layer, the anode coupled to a first end of the fuse channel; forming a cathode in the dielectric layer, the cathode coupled to a second end of the fuse channel, opposite the first end; and forming a dummy region in the dielectric layer, wherein the dummy region is separated from the fuse channel, the anode, and the cathode by a dielectric material of the dielectric layer, and wherein the dummy region is formed of a metal.

Example 10 is the method of Example 9, wherein the metal of the dummy region is the same as a metal of the fuse channel.

Example 11 is the method of Example 9, further comprising:

forming a first metallization layer on the substrate, the first metallization layer including a first pair of trenches and a second pair of trenches, wherein a first separation distance between the first pair of trenches is greater than a second separation distance between the second pair of trenches by a factor of two or more, and wherein the fuse channel is formed on a region of the first metallization layer between the first pair of trenches.

Example 12 is the method of Example 11, wherein trenches of the first pair of trenches and the second pair of trenches are separated from one another by an interlayer dielectric (ILD), wherein the ILD forms a protrusion between the first pair of trenches, and wherein the fuse channel is formed on the protrusion.

Example 13 is the method of Example 12, wherein the anode is formed on a first side of the protrusion, the cathode is formed on a second side of the protrusion, and the fuse channel is formed across the protrusion.

Example 14 is the method of Example 12, further comprising forming an etch stop layer on the first metallization layer, wherein the fuse channel is formed in contact with the etch stop layer.

Example 15 is the method of Example 9, wherein a width of the dielectric material between the fuse channel and the dummy region is less than 100 nanometers.

Example 16 is the method of Example 9, wherein the dummy region is formed between the anode and the cathode.

Example 17 is the method of Example 9, wherein the dummy region is a first dummy region, and wherein the method further comprises forming a second dummy region adjacent to the fuse channel on an opposite side of the fuse channel from the first dummy region, wherein the second dummy region is separated from the fuse channel, the anode, and the cathode by the dielectric material.

Example 18 is the method of Example 9, further comprising planarizing a top surface of the dielectric layer prior to forming the fuse channel, the anode, the cathode, and the dummy region.

Example 19 is the method of any one of Examples 9 to 18, further comprising performing chemical mechanical planarization (CMP) on the dielectric layer after forming the fuse channel, the anode, the cathode, and the dummy region to reduce a thickness of the fuse channel.

Example 20 is a computing system comprising: a memory; a network interface; and a processor coupled to the memory and the network interface. The processor includes: a fuse array, wherein a first fuse of the fuse array includes a fuse channel, an anode coupled to a first end of the fuse channel, and a cathode coupled to a second end of the fuse channel; a dummy region disposed adjacent the fuse channel between the anode and the cathode, wherein the dummy region includes a metal; and a dielectric material separating the dummy region from the fuse channel, the anode, and the cathode.

Example 21 is the system of Example 20, wherein the processor further includes: a first metallization layer including a plurality of trenches separated by an interlayer dielectric (ILD), wherein the ILD forms a protrusion that extends above a top surface of the trenches; and an etch stop layer disposed on the first metallization layer, wherein the fuse channel is disposed on and in contact with the etch stop layer directly above the protrusion.

Example 22 is the system of Example 21, wherein the plurality of trenches include a first pair of adjacent trenches and a second pair of adjacent trenches, wherein the protrusion is disposed between the first pair of trenches, and wherein a first separation distance between the first pair of trenches is greater than a second separation distance between the second pair of trenches by a factor of two or more.

Example 23 is the system of Example 20, wherein the dummy region is a first dummy region, and wherein the integrated circuit further includes a second dummy region disposed adjacent to the fuse channel on an opposite side of the fuse channel from the first dummy region, wherein the second dummy region is separated from the fuse channel, the anode, and the cathode by the dielectric material.

Example 24 is the system of Example 20, wherein the fuse channel is formed of the same metal as the dummy region.

Example 25 is the system of any one of Examples 20 to 24, further comprising a display coupled to the processor.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An integrated circuit comprising:
a first metallization layer including a plurality of trenches separated by an interlayer dielectric (ILD), wherein the ILD forms a protrusion that extends above a top surface of the trenches;
an etch stop layer on the first metallization layer; and
a fuse on the etch stop layer, wherein the fuse includes a fuse channel coupled between an anode and a cathode, wherein the fuse channel is directly above the protrusion and is in contact with the etch stop layer.

2. The integrated circuit of claim 1, further comprising a dummy region of a metal and disposed adjacent to the fuse channel, wherein the dummy region is separated from the fuse channel, the anode, and the cathode by a dielectric material.

3. The integrated circuit of claim 2, wherein a width of the dielectric material between the fuse channel and the dummy region is less than 100 nanometers.

4. The integrated circuit of claim 2, wherein the dummy region is between the anode and the cathode.

5. The integrated circuit of claim 2, wherein the dummy region is a first dummy region, and wherein the integrated circuit further includes a second dummy region adjacent to the fuse channel on an opposite side of the fuse channel from the first dummy region, wherein the second dummy region is separated from the fuse channel, the anode, and the cathode by the dielectric material.

6. The integrated circuit of claim 2, wherein the fuse channel and the dummy region include copper.

7. The integrated circuit of claim 1, wherein the anode is disposed on a first side of the protrusion, the cathode is on a second side of the protrusion, and the fuse channel extends across the protrusion.

8. The integrated circuit of claim 1, wherein the plurality of trenches include a first pair of adjacent trenches and a second pair of adjacent trenches, wherein the protrusion is between the first pair of trenches, and wherein a first separation distance between the first pair of trenches is greater than a second separation distance between the second pair of trenches by a factor of two or more.

9. A computing system comprising:
a memory;
a network interface; and
a processor coupled to the memory and the network interface, the processor including:
a fuse array, wherein a first fuse of the fuse array includes a fuse channel, an anode coupled to a first end of the fuse channel, and a cathode coupled to a second end of the fuse channel;
a dummy region adjacent the fuse channel between the anode and the cathode, wherein the dummy region includes a metal; and
a dielectric material separating the dummy region from the fuse channel, the anode, and the cathode.

10. The system of claim 9, wherein the processor further includes:
a first metallization layer including a plurality of trenches separated by an interlayer dielectric (ILD), wherein the ILD forms a protrusion that extends above a top surface of the trenches; and
an etch stop layer on the first metallization layer, wherein the fuse channel is on and in contact with the etch stop layer directly above the protrusion.

11. The system of claim 10, wherein the plurality of trenches include a first pair of adjacent trenches and a second pair of adjacent trenches, wherein the protrusion is between the first pair of trenches, and wherein a first separation distance between the first pair of trenches is greater than a second separation distance between the second pair of trenches by a factor of two or more.

12. The system of claim 9, wherein the dummy region is a first dummy region, and wherein the integrated circuit further includes a second dummy region adjacent to the fuse channel on an opposite side of the fuse channel from the first dummy region, wherein the second dummy region is separated from the fuse channel, the anode, and the cathode by the dielectric material.

13. The system of claim 9, wherein the fuse channel includes the same metal as the dummy region.

14. The system of claim 9, further comprising a display coupled to the processor.

* * * * *